(12) United States Patent
Tuttle

(10) Patent No.: US 7,634,851 B2
(45) Date of Patent: Dec. 22, 2009

(54) METHOD OF FORMING A MAGNETIC RANDOM ACCESS MEMORY ELEMENT

(75) Inventor: Mark E. Tuttle, Boise, ID (US)

(73) Assignee: Micron Technology, Inc., Boise, ID (US)

(*) Notice: Subject to any disclaimer, the term of this patent is extended or adjusted under 35 U.S.C. 154(b) by 42 days.

(21) Appl. No.: 11/476,004

(22) Filed: Jun. 28, 2006

(65) Prior Publication Data

US 2006/0245118 A1    Nov. 2, 2006

Related U.S. Application Data

(62) Division of application No. 10/759,078, filed on Jan. 20, 2004, now Pat. No. 7,284,315, which is a division of application No. 10/120,512, filed on Apr. 12, 2002, now Pat. No. 6,903,396.

(51) Int. Cl.
    *G11B 5/193* (2006.01)

(52) U.S. Cl. ............... 29/603.14; 29/603.12; 29/603.13; 360/322; 360/324; 360/324.12

(58) Field of Classification Search ............... 29/603.14, 29/603.13, 603.07, 603.12; 428/811.1, 811.2; 360/322, 324, 324.1, 324.11, 324.12, 324.2, 360/327.1, 327.2
    See application file for complete search history.

(56) References Cited

U.S. PATENT DOCUMENTS

| | | | |
|---|---|---|---|
| 4,256,816 A | | 3/1981 | Dunkleberger |
| 4,420,365 A | | 12/1983 | Lehrer |
| 5,201,995 A | | 4/1993 | Reisman et al. |
| 5,496,759 A | | 3/1996 | Yue et al. |
| 5,569,617 A | | 10/1996 | Yeh et al. |
| 5,646,805 A | * | 7/1997 | Shen et al. ............... 360/327.1 |
| 5,702,831 A | | 12/1997 | Chen et al. |
| 5,828,531 A | * | 10/1998 | Gill ........................ 360/324.12 |
| 5,956,267 A | | 9/1999 | Hurst et al. |
| 6,108,177 A | * | 8/2000 | Gill ........................ 360/324.12 |
| 6,130,835 A | | 10/2000 | Scheuerlein |
| 6,181,537 B1 | | 1/2001 | Gill |

(Continued)

FOREIGN PATENT DOCUMENTS

JP            9-282616      * 10/1997

(Continued)

OTHER PUBLICATIONS

Zhi G. Wang, et al.—"Feasibility of Ultra-Dense Spin-Tunneling Random Access Memory," IEEE Transactions on Magnetics, vol. 33, No. 6, Nov. 1997.

*Primary Examiner*—A. Dexter Tugbang
(74) *Attorney, Agent, or Firm*—Dickstein Shapiro LLP

(57) ABSTRACT

A method of forming a magnetic tunnel junction memory element and the resulting structure are disclosed. A magnetic tunnel junction memory element comprising a thick nonmagnetic layer between two ferromagnetic layers. The thick nonmagnetic layer has an opening in which a thinner tunnel barrier layer is disposed. The resistance of a magnetic tunnel junction memory element may be controlled by adjusting the surface area and/or thickness of the tunnel barrier layer without regard to the surface area of the ferromagnetic layers.

17 Claims, 13 Drawing Sheets

U.S. PATENT DOCUMENTS

| | | |
|---|---|---|
| 6,183,859 B1 | 2/2001 | Chen et al. |
| 6,211,090 B1 | 4/2001 | Duriam et al. |
| 6,211,559 B1 | 4/2001 | Zhu et al. |
| 6,261,646 B1 | 7/2001 | Chen et al. |
| 6,452,764 B1 | 9/2002 | Abraham et al. |
| 6,657,246 B2 | 12/2003 | Ono et al. |
| 2002/0036331 A1 | 3/2002 | Nickel et al. |
| 2003/9206382 | 11/2003 | Carey et al. |

FOREIGN PATENT DOCUMENTS

| | | |
|---|---|---|
| JP | 11-68192 | 3/1999 |

\* cited by examiner

METHOD OF FORMING A MAGNETIC RANDOM ACCESS MEMORY ELEMENT

CROSS REFERENCES TO RELATED APPLICATIONS

This application is a divisional of U.S. application Ser. No. 10/759,078, filed Jan. 20, 2004, now U.S. Pat. No. 7,284,315, which is a divisional of U.S. application Ser. No. 10/120,512, filed Apr. 12, 2002, now U.S. Pat. No. 6,903,396, the entire disclosures of which are incorporated herein by reference in their entirety.

FIELD OF THE INVENTION

The invention relates to MRAM semiconductor structures, in particular, a method of forming a magnetic tunnel junction (MTJ) memory element and the resulting structure.

BACKGROUND OF THE INVENTION

A magnetic random access memory (MRAM) is a non-volatile memory which uses multiple layers of magnetoresistive materials as memory storage elements. A typical MRAM array includes a number of conductive bit or digit lines intersected by conductive word lines. At each intersection, a magnetoresistive element, commonly referred to as a magnetic tunnel junction (MTJ) memory element is formed. Each magnetic memory element includes a first pinned ferromagnetic material layer (where the magnetic field is fixed) and a second free ferromagnetic material layer (where the magnetic field can, by programming, assume two different orientations). The two ferromagnetic layers are separated by a non-magnetic layer, commonly referred to as the tunnel barrier layer. The direction of the magnetic vectors in the free and pinned layers, determines the stored state of the magnetic memory element. As such, the magnetic memory element has two stable magnetic states. In one magnetic direction of the free layer the memory element has a high resistance defined as one logic value, e.g. "0" and in the other magnetic direction of the free layer the memory element has a low resistance, defined as the other logic value, e.g. "1." The stored state of the memory element is generally read by providing a sense current through the magnetic memory element to determine its resistance.

FIG. 1 illustrates an exemplary conventional MRAM structure including three magnetic memory elements 22, having respective associated conductive lines 18 and 28 which may serve as word lines and bit lines. Conductive lines 18, typically formed of copper, are formed in an insulating layer 16 formed over under-layers 14 of an integrated circuit (IC) substrate 10. Under-layers 14 may include, for example portions of integrated circuitry, such as CMOS circuitry. A pinned layer 20 is provided over the conductive lines 18. A tunnel barrier layer 24 is provided over the pinned layer 20. The tunnel barrier layer 24 is generally formed of aluminum oxide. A free layer 26 is provided over the tunnel barrier layer 24. Another conductive line 28 is formed over the free layer 26.

Generally, the resistance across the magnetic memory element 22 is dependent on both the surface area and thickness of the tunnel barrier layer 24. However, in the fabrication of conventional MRAM structures, the surface area of the tunnel barrier layer 24 is equivalent to the surface area of the free layer 26. Consequently, controlling the resistance of the magnetic memory element 22 is limited to adjusting the thickness of the tunnel barrier layer 24. Accordingly, conventional methods used for reducing the resistance of the tunnel barrier layer, require making the tunnel barrier layer as thin as possible, which is generally between about 5 Angstroms to about 20 Angstroms. However, having such a thin tunnel barrier layer 24 does not provide adequate protection against a short 23 being formed across the tunnel barrier layer 24 at edges of the magnetic memory element 22, which may occur during the etch patterning of the magnetic memory element 22. A shorted magnetic memory element 22 can not store a logic value of a "1" or "0" as different resistance values.

Accordingly, there is a need for an improved method for forming magnetic memory elements having greater reliability against shorting. There is also a need for a method for forming a magnetic memory element where the resistance across the tunnel barrier layer can be set independently of the surface area of a corresponding free layer.

BRIEF SUMMARY OF THE INVENTION

In one aspect, the invention provides a magnetic memory element having a thin tunnel barrier layer which is surrounded by a thicker dielectric layer during fabrication for preventing shorting across the magnetic memory element, and a method for forming the structure. In another aspect, the invention provides a method of controlling the resistance of a magnetic memory element by permitting fabrication of the surface area of the tunnel barrier layer to be independent of the surface area of the free or pinned layer.

These and other features and advantages of the invention will be more apparent from the following detailed description, which is provided in connection with the accompanying drawings, which illustrate exemplary embodiments of the invention.

DETAILED DESCRIPTION OF THE INVENTION

Figure 1:
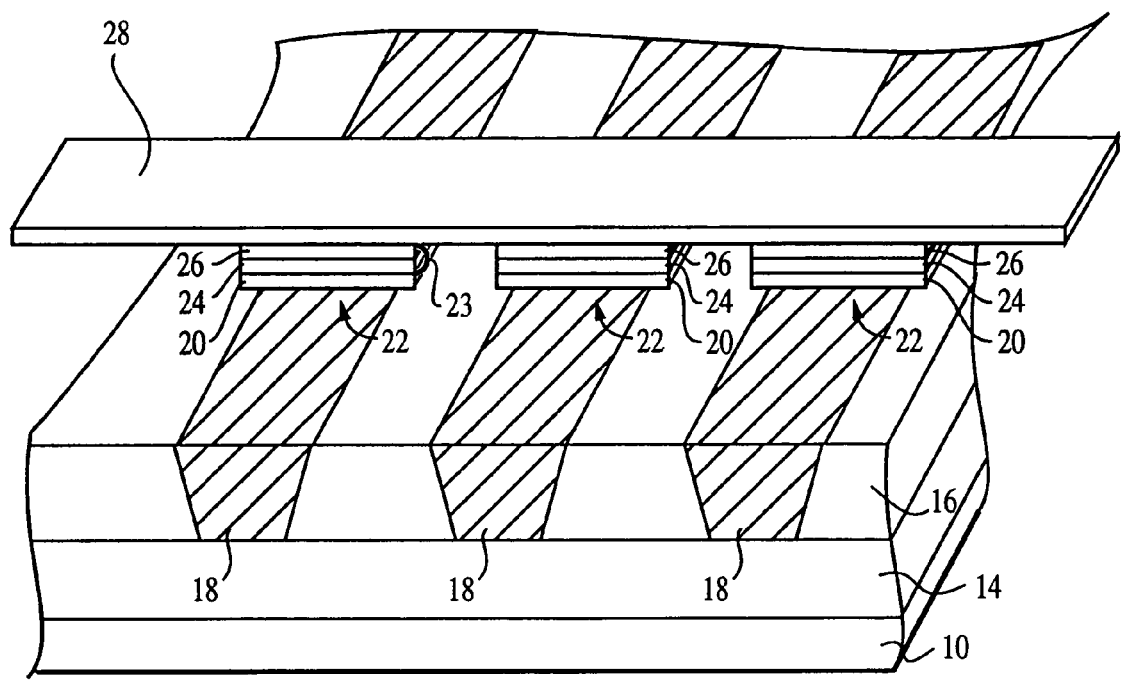
FIG. 1 is a schematic three-dimensional view of a portion of a conventional magnetic memory element array structure.

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the invention.

The term "substrate" used in the following description may include any semiconductor-based structure that has an exposed semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, or germanium. When reference is made to a substrate in the following description, previous process steps may have been utilized to form regions or junctions in or on the base semiconductor or foundation.

The invention provides a method for fabricating MRAM memory elements which include a magnetic tunnel junction. The MRAM memory element may be formed over a substrate. The substrate may contain integrated circuitry for operating MRAM memory elements, such as CMOS devices and other circuitry. In the invention, a thin dielectric layer is deposited over a thicker dielectric layer and within an opening in the thicker dielectric layer so that the thinner dielectric layer contacts a ferromagnetic layer and functions as the tunnel barrier layer. The thicker dielectric layer prevents shorting across the magnetic memory element during fabrication. In addition, the surface area of the tunnel barrier layer, and thereby the resistance of the memory element can be controlled by the size of the opening irrespective of the surface area of the free layer. Thus, a tunnel barrier layer having a smaller surface area than an associated free layer may be used.

Referring now to the drawings, where like elements are designated by like reference numerals, FIGS. 2 through 13 illustrate an exemplary embodiment of a method of forming a magnetic memory element according to the invention. While the structure described herein is depicted in sectional views of a single magnetic memory element for convenience, it should be understood that the figures represent a portion of an array of such structures. In addition, each magnetic memory element can be any suitable top view shape, for instance rectangular, square, diamond, circular, polygonal, or elliptical, as desired.

Figure 2:
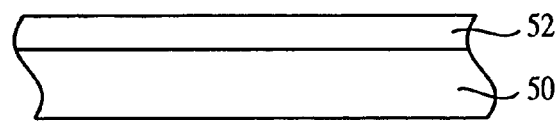
FIG. 2 illustrates a partial cross-sectional view of a semiconductor topography, at an intermediate stage of processing, to form a magnetic memory element in accordance with the invention.

FIG. 2 depicts a portion of a semiconductor substrate 50 on which underlying active circuit layer 52 has been formed. The underlying layer 52 may include, for example, integrated circuit layers forming CMOS devices and circuits which are used to operate an MRAM device containing many memory elements.

Figure 3:
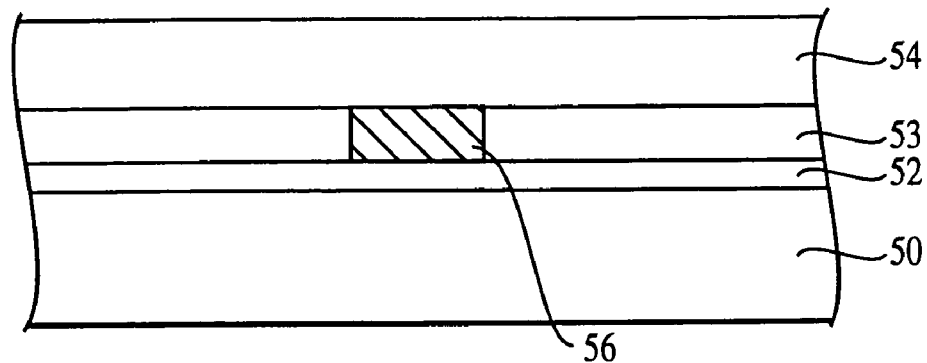
FIG. 3 illustrates a partial cross-sectional view of the memory element structure of the invention at a stage of processing subsequent to that shown in FIG. 2.

Referring now to FIG. 3, a first insulating layer 53 is formed over the substrate 50 and the underlying layer 52. A conductive via 56 is formed within the first insulating layer 53. Next a second insulating layer 54 is formed over the first insulating layer 53 and the conductive via 56. In an exemplary embodiment of the invention, the insulating layers 53 and 54 are blanket deposited by plasma enhanced chemical vapor deposition (PECVD) to a thickness of about 1,000 Angstroms to about 10,000 Angstroms. However, other known deposition methods, such as sputtering by chemical vapor deposition (CVD), spin coating, or physical vapor deposition (PVD), may be used also in accordance with the desired characteristics of the underlying layer 52. The insulating layers 53 and 54 may be formed of a conventional insulator, for example, a thermal oxide of silicon, such as SiO or $SiO_2$, or a nitride, such as $Si_3N_4$, or BPSG. Alternatively, a high temperature polymer, such as a polyimide, or a low dielectric constant inorganic material may also be employed.

Figure 4:
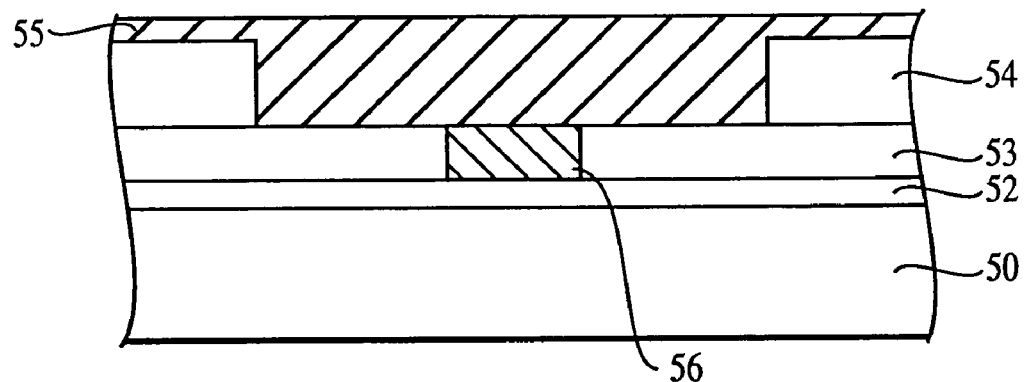
FIG. 4 illustrates a partial cross-sectional view of the memory element structure of the invention at a stage of processing subsequent to that shown in FIG. 3.

Referring now to FIG. 4, a trench is patterned in the insulating layer 54 to expose an upper surface of the conductive via 56. A conductive layer 55 is formed over the substrate to contact the conductive via 56. The conductive material layer 55 may be formed of any suitable material or multiple layers of material. Preferably, the conductive material comprises copper (Cu). However, other suitable conductive materials such as aluminum, tungsten or gold, among others, may be used also. Furthermore, metal alloys may also be used, depending on the desired characteristics of the IC device.

Figure 5:
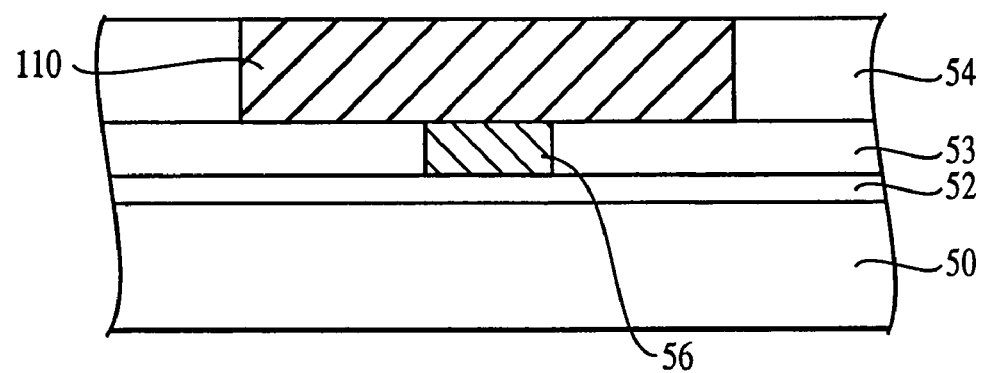
FIG. 5 illustrates a partial cross-sectional view of the memory element structure of the invention at a stage of processing subsequent to that shown in FIG. 4.

Referring now to FIG. 5 the conductive material layer 55 is formed into the first conductive line 110 via chemical mechanical planarization (CMP). In a preferred embodiment, the conductive material comprises copper (Cu). However, other conductive materials such as doped polysilicon, aluminum, tungsten or gold, among others, may be used also. Further, metal alloys and conductive metal oxides may be employed.

Figure 6:
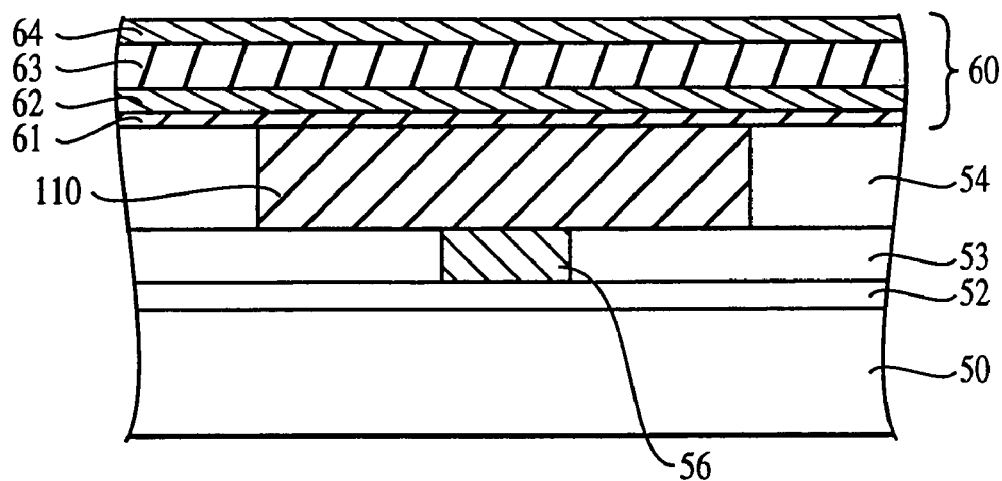
FIG. 6 illustrates a partial cross-sectional view of the memory element structure of the invention at a stage of processing subsequent to that shown in FIG. 5.

Referring now to FIG. 6, a pinning structure 60 is formed over the conductive line 110. The pinning structure 60 may comprise at least one magnetic layer and may further comprise one or more nonmagnetic layers. The pinning structure 60 may be formed of various material layers, described below in more detail, which are successively deposited over the conductive line 110.

In one exemplary embodiment of the invention as illustrated in FIG. 6, a first tantalum (Ta) layer 61 (of about 20-400 Angstroms thick, more preferably of about 50 Angstroms thick), a nickel-iron (NiFe) seed layer 62 (of about 10-100 Angstroms thick, more preferably of about 60 Angstroms thick), a manganese-iron (MnFe) anti-ferromagnetic layer 63 (of about 10-100 Angstroms thick, more preferably of about 100 Angstroms thick) and a nickel-iron (NiFe) pinned layer 64 (of about 10-100 Angstroms thick, more preferably of about 60 Angstroms thick) are successively blanket deposited over the substrate to form the pinning structure 60. Deposition of the layers 61, 62, 63, and 64 may be accomplished by magnetron sputtering, for example. However, other conventional deposition methods may also be used, as desired.

Figure 7:
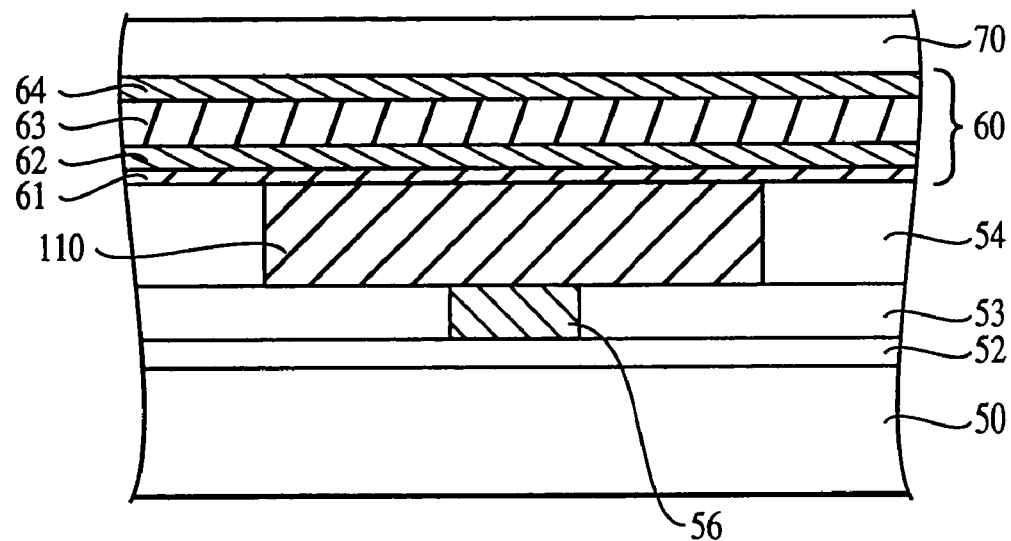
FIG. 7 illustrates a partial cross-sectional view of the memory element structure of the invention at a stage of processing subsequent to that shown in FIG. 6.

As shown in FIG. 7, following the formation of the pinning structure 60, a nonmagnetic material, for example, a first dielectric layer 70 is formed overlying the pinning structure 60. The first dielectric layer 70 is preferably formed of aluminum oxide ($Al_2O_3$), although other nonmagnetic materials can also be used, such as a thermal oxide of silicon, e.g., SiO or $SiO_2$, silicon nitride ($Si_3N_4$), titanium oxide ($TiO_2$), magnesium oxide (MgO), or aluminum nitride (AlN). The first dielectric layer 70 is preferably a thicker layer than generally used for conventional tunnel barrier layers and is preferably a thickness of between about 20 Angstroms to about 300 Angstroms. Accordingly, due to the thickness of the first dielectric layer 70, tunneling is inhibited in this layer.

Figure 8:
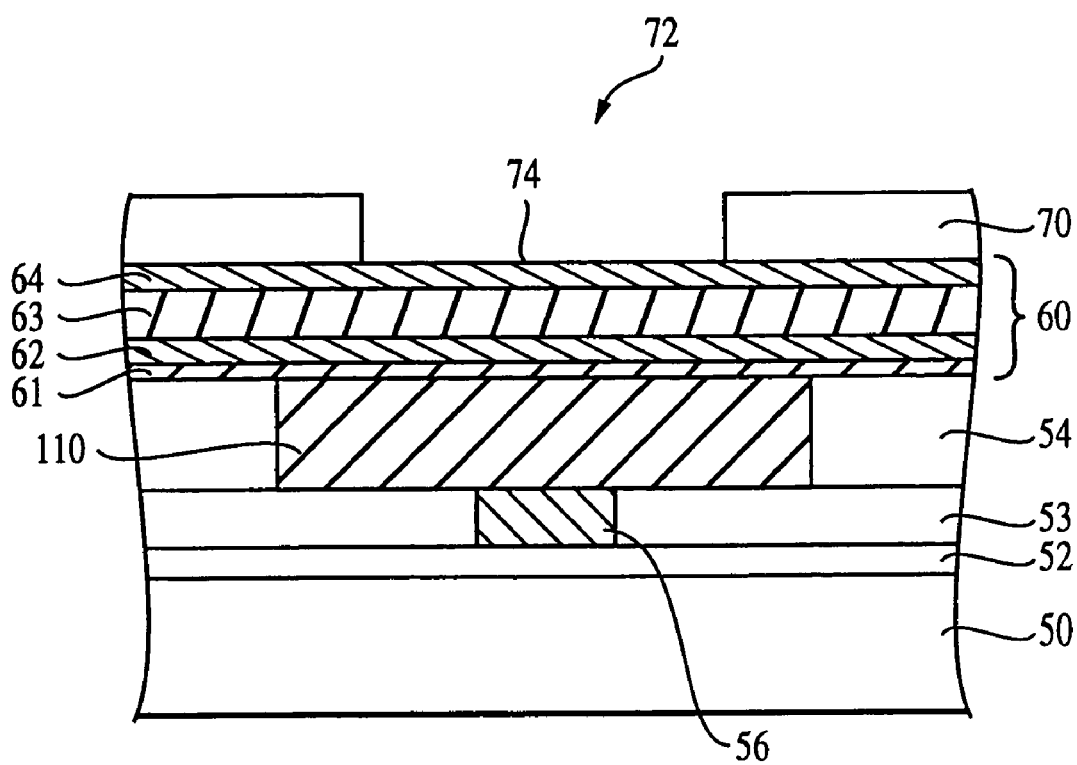
FIG. 8 illustrates a partial cross-sectional view of the memory element structure of the invention at a stage of processing subsequent to that shown in FIG. 7.

Referring now to FIG. 8, an etch is performed to form opening 72 and expose an upper surface 74 of the pinned layer 64. The etch may be a conventional wet etch or a reactive ion etch (RIE). The opening 72 may be formed in any desired shape or size. For instance, the opening may be rectangular, square, diamond, circular, polygonal, or elliptical.

Figure 9:
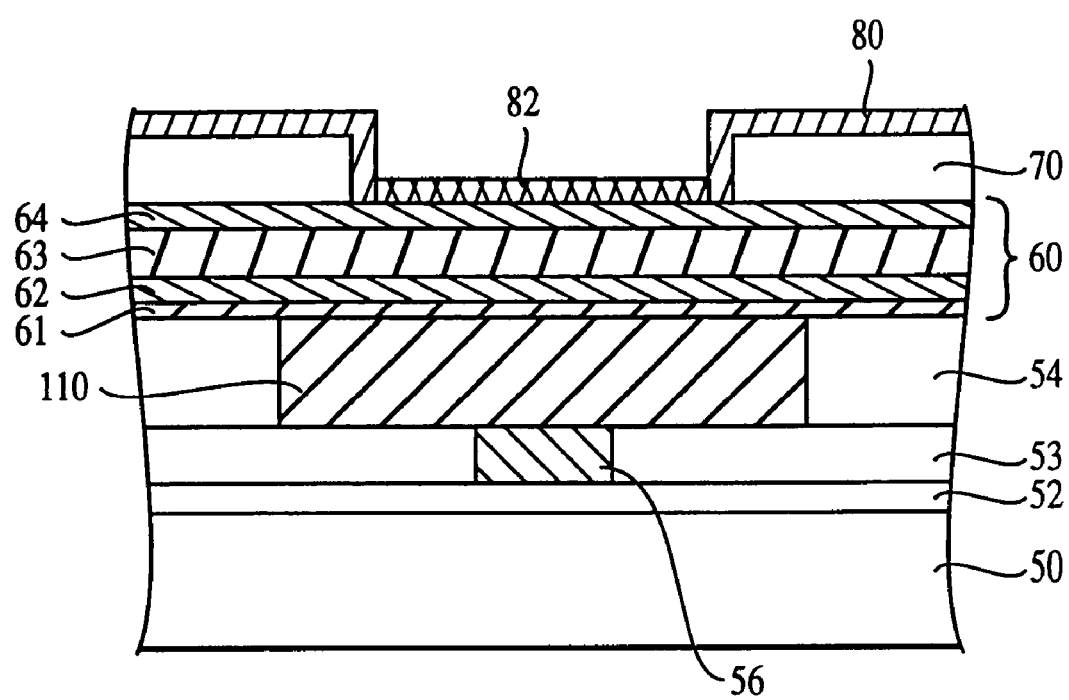
FIG. 9 illustrates a partial cross-sectional view of the memory element structure of the invention at a stage of processing subsequent to that shown in FIG. 8.

Referring now to FIG. 9, a second nonmagnetic material layer 80 is deposited over the first dielectric layer 70 and the exposed upper surface 74 of the pinned layer 64. The second nonmagnetic layer 80 may be any nonmagnetic material, but is preferably aluminum oxide ($Al_2O_3$), although other nonmagnetic materials may be used. The second nonmagnetic layer 80 may be any suitable thickness for promoting tunneling and is preferably, from about 5 Angstroms to about 20 Angstroms thick. Accordingly, the second nonmagnetic layer 80 is sufficiently thin to provide a tunnel barrier layer 82 (shown as cross-hatched) over the exposed upper surface 74 of the pinned layer 64. Since the tunnel barrier layer 82 is formed in opening 72 it may have any suitable top-view shape as determined by the shape of the opening 72. For instance, the tunnel barrier layer in top view may be rectangular, square, diamond, circular, polygonal, or elliptical, as desired. Preferably, the surface area of the tunnel barrier layer 82 is smaller than a surface area of a subsequently formed free layer. As shown in FIG. 9, the tunnel barrier layer 82 contacts the pinned layer 64. The second nonmagnetic layer 80 may be formed of the same material as the first layer 70, or of a different material.

Figure 10:
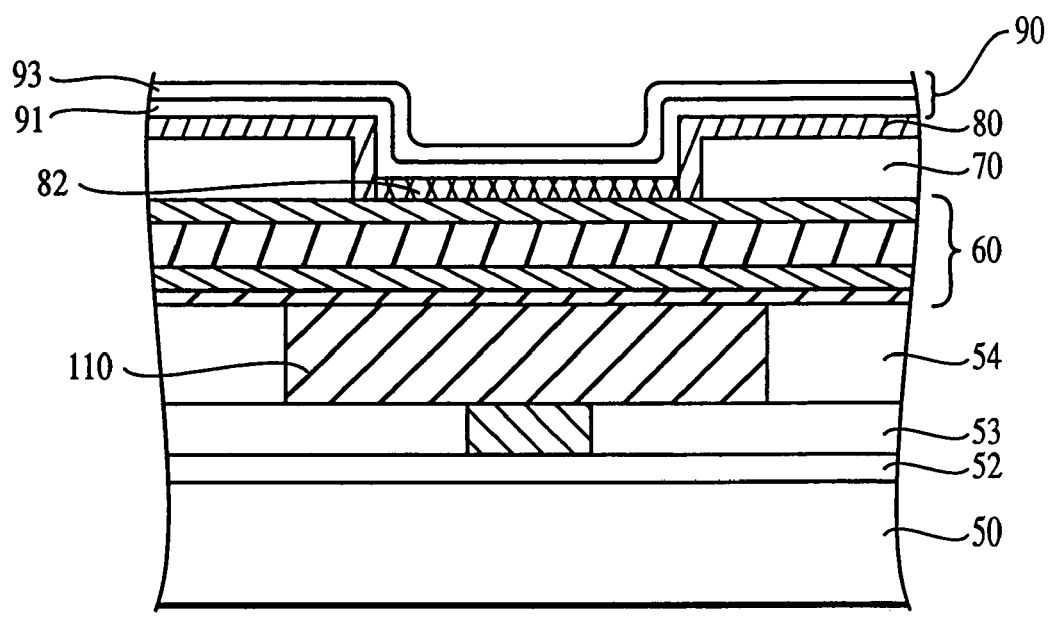
FIG. 10 illustrates a partial cross-sectional view of the memory element structure of the invention at a stage of processing subsequent to that shown in FIG. 9.
Figure 11:
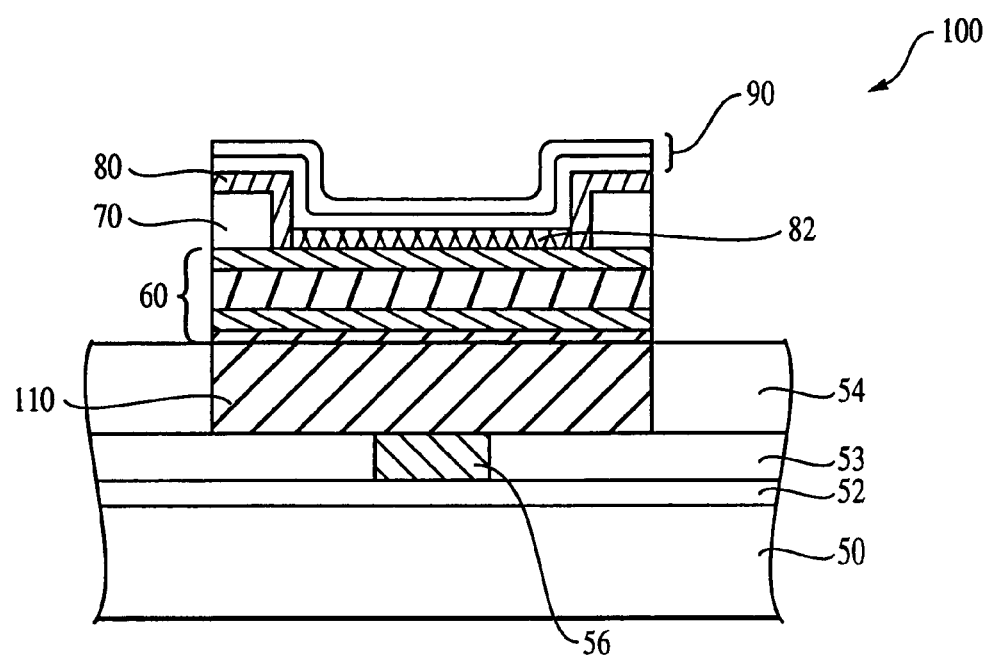
FIG. 11 illustrates a partial cross-sectional view of the memory element of the invention in a first embodiment at a stage of processing subsequent to that shown in FIG. 10.

Referring now to FIG. 10, a free, also referred to as sensing, structure 90 is deposited over the second nonmagnetic layer 80. The sensing structure 90, like the pinning structure 60, may also comprise a plurality of layers 91, 93. The layers may be formed of various material layers, which are successively deposited over the second nonmagnetic layer 80.

In an exemplary embodiment of the invention, a nickel-iron free layer 91 (of about 10-100 Angstroms thick, more preferably of about 40 Angstroms thick) and a tantalum cap layer 93 (of about 20-400 Angstroms thick, more preferably of about 50 Angstroms thick) are successively blanket deposited over the second nonmagnetic layer 80 to form the sensing structure 90. Deposition of the layers 91 and 93 may be accomplished by magnetron sputtering, for example, but other conventional deposition methods may be used also.

The magnetic tunnel junction memory element 100 may then be patterned by etching the FIG. 10 structure as desired. In one embodiment shown in FIG. 11 at a processing segment subsequent to that shown in FIG. 10, the functional layers of the magnetic tunnel junction memory element 100, i.e., the sensing structure 90, the first and second nonmagnetic layers 70, 80 and the pinning structure 60 may be patterned and etched to any suitable size or shape to define the memory elements, irrespective of the shape of the tunnel barrier layer 82. Preferably, the surface area of the sensing structure 90 is larger than the surface area of the tunnel barrier layer 82.

Figure 12:
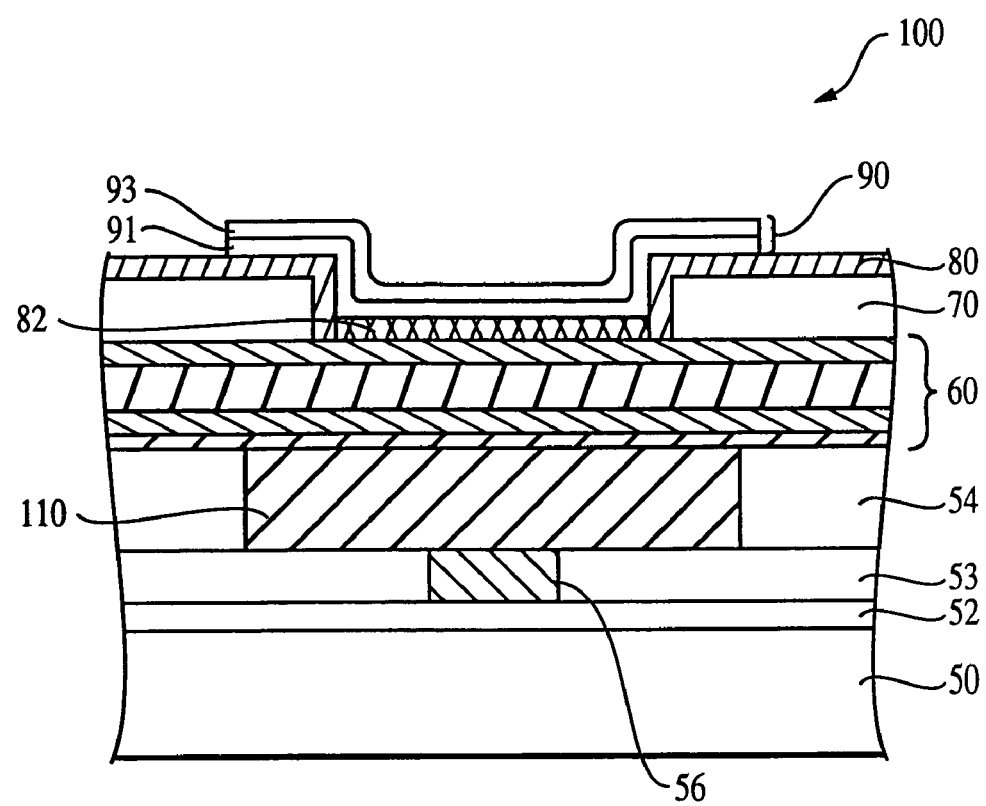
FIG. 12 illustrates a partial cross-sectional view of the memory element of the invention in a second embodiment at a stage of processing subsequent to that shown in FIG. 10.

In an alternative embodiment, shown in FIG. 12 the sensing structure 90 alone may be patterned and etched to any suitable size or shape. For instance, as shown in FIG. 12, the surface area of the sensing structure 90 may be larger than the surface area of the tunnel barrier layer 82.

Patterning of the magnetic tunnel junction memory element 100, may be accomplished by any suitable method. For instance, ion miling, which typically involves physical sputtering of each layer by an argon ion beam, may be used. Patterning may be also accomplished by using a reactive plasma etch, performed, for example, in electron cyclotron resonance (ECR) or other high density plasmas, such as an inductively coupled plasma system, or a helicon plasma system containing chlorine as the source gas. A mixture of chlorine with other gases, such as argon, neon or helium, among others, may be used also.

Figure 13:
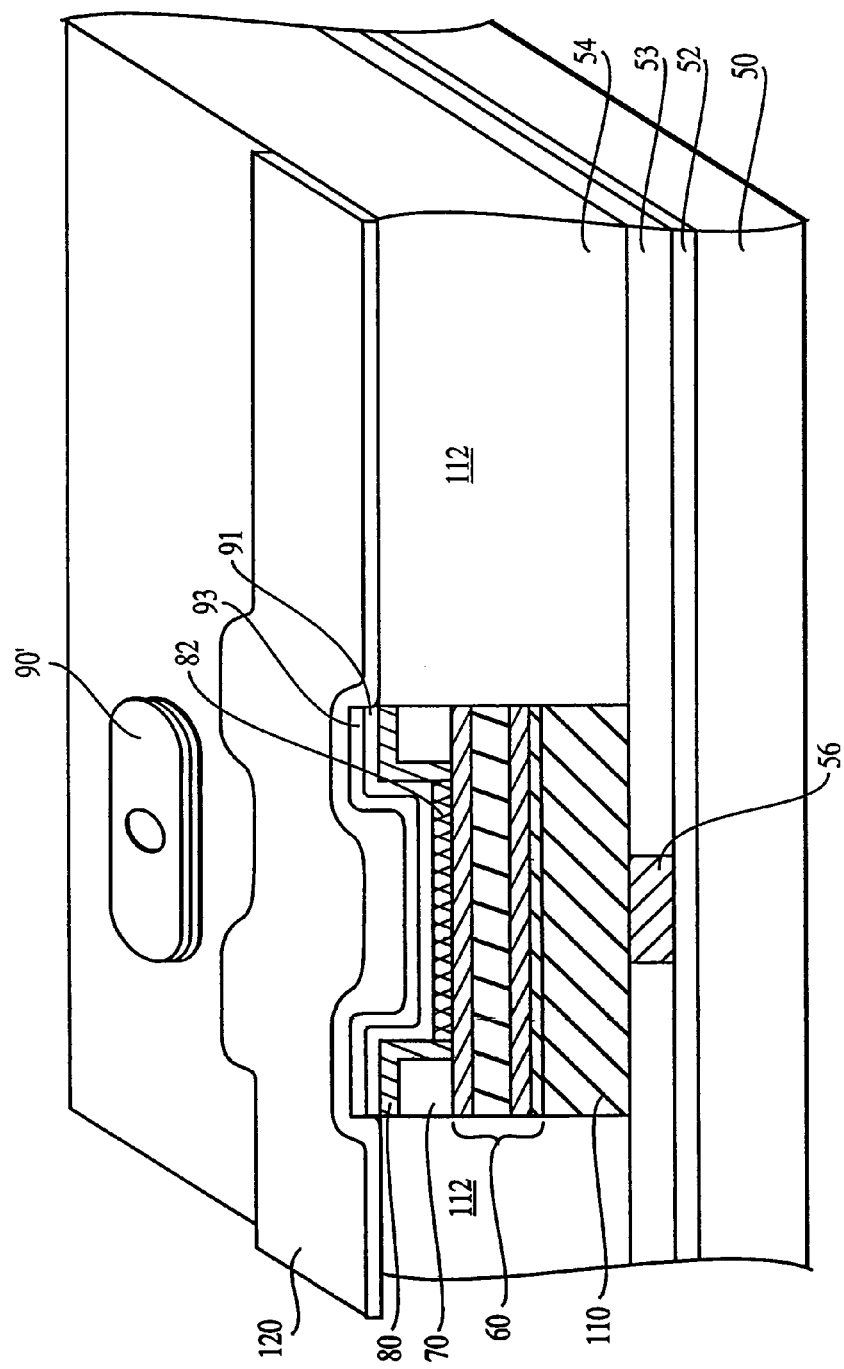
FIG. 13 illustrates a partial three-dimensional view of the memory element of the invention at a stage of processing subsequent to that shown in FIG. 12.

Additional steps to create a functional magnetic random access memory structure may now be carried out. Thus, additional insulating layers and write conductors to enable bidirectional current flow in the presence of a write signal may be formed to complete the magnetic random access memory structure. For example, FIG. 13 illustrates a magnetic random access memory formed of the FIG. 11 structure further fabricated with an oxide layer 112 that is planarized via CMP and a conductive line 120, which is orthogonal to the conductive line 110. FIG. 13 shows just one such conductive line 120 for clarity and also shows the sensing structure 90' of a second memory element which would also have an associated conductive line 120, which is omitted from FIG. 13 for clarity. As known in the art, the conductive lines may be formed of copper, for example.

Figure 14:
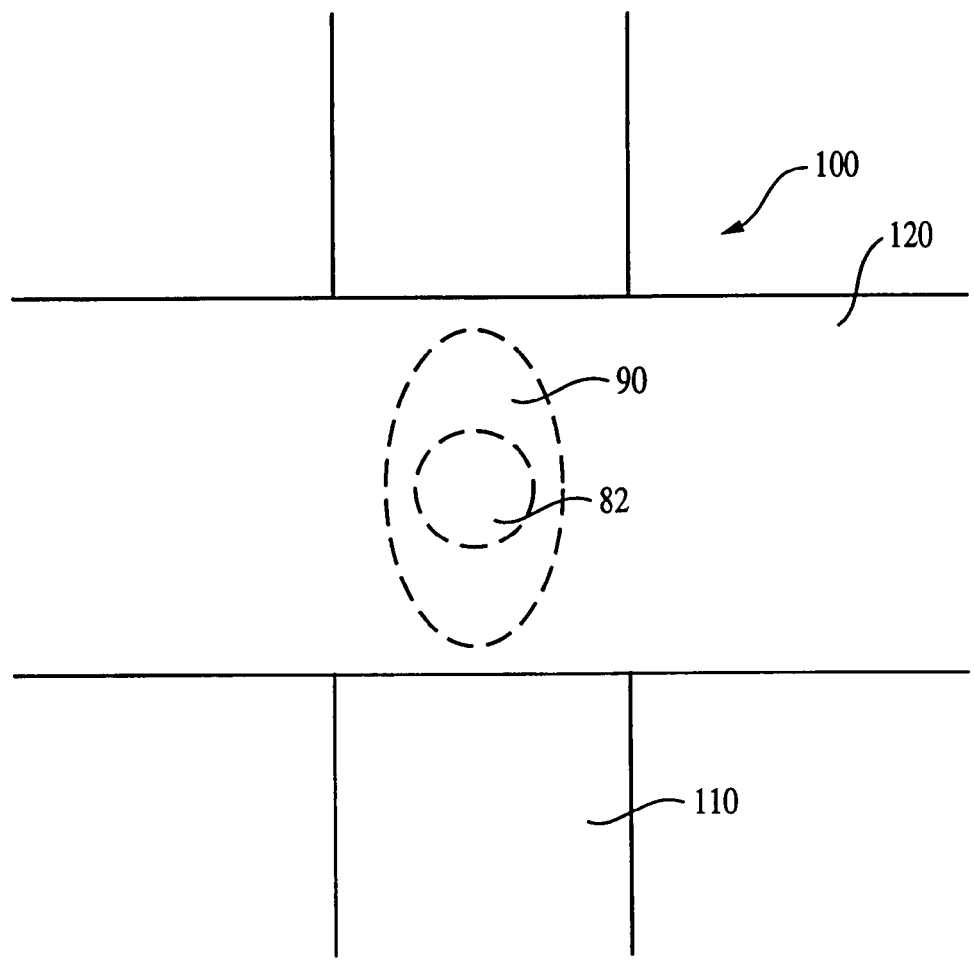
FIG. 14 illustrates a partial top down cross-sectional view of the memory element of the invention at a stage of processing subsequent to that shown in FIG. 10 in accordance with yet another embodiment of the invention.

FIG. 14 shows a top down view of a memory element 100 provided between a conductive line 110 and an orthogonal conductive line 120. The hidden tunnel barrier layer 82, (shown in dotted line) encompasses an area having a smaller surface area than the area of the hidden sensing structure 90 (shown in dotted line). The hidden sensing structure 90 is shown having an oval cross-sectional shape while the tunnel barrier layer 82 is shown having a circular area. The same or different shapes for both are possible. In addition, the shapes are not limited to oval or circular shapes. The tunnel barrier layer 82, although shown centered within the surface area of the sensing structure 90, may be positioned in any suitable position within the surface area of the sensing structure 90, for example, the tunnel barrier layer 82 may be off-center.

Although the embodiments described above refer to the formation of only one magnetic tunnel junction memory element, it must be understood that the invention contemplates the formation of any number of magnetic memory elements, which can be fabricated in a memory array. For example, it is to be understood that the sensing structure may be patterned into a plurality of rows and columns of spaced memory elements having associated pinned layers, free layers, and tunnel barrier layers. It is also to be understood that although the above exemplary description describes the tunnel barrier layer 82 as overlying the pinning structure 60, the cell may be constructed with layer 60 as the sensing structure and layer 90 as the pinning structure. Accordingly the tunnel barrier layer may overly the free layer 91 with the pinned layer 64 overlying the tunnel barrier layer.

Figure 15:
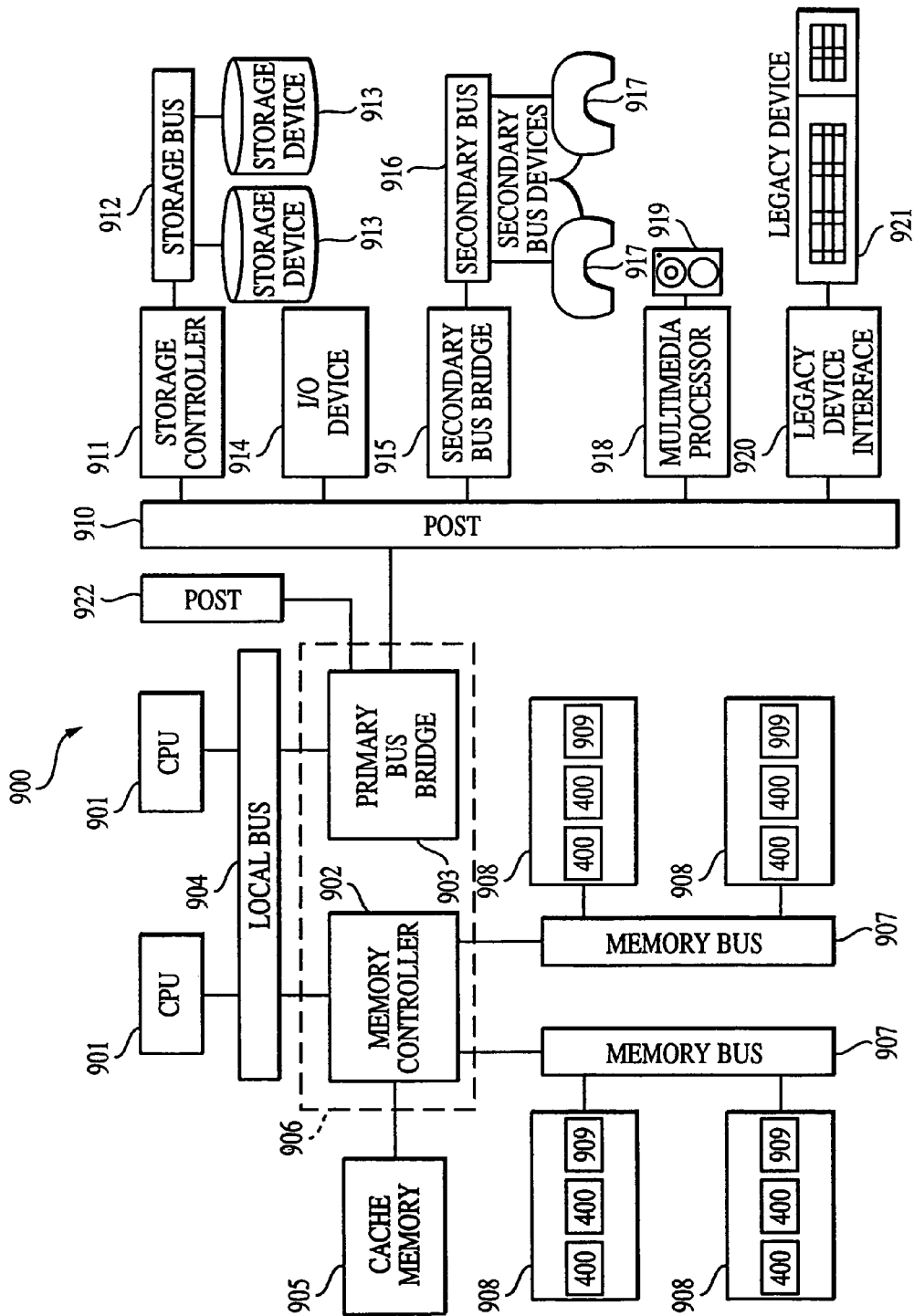
FIG. 15 is a schematic diagram of a processor system incorporating an MRAM memory circuit device constructed in accordance with the invention.

FIG. 15 illustrates an exemplary processing system 900 which may utilize a memory device 400 which incorporates the magnetic tunnel junction memory element 100 according to the invention as described above with reference to FIGS. 2 through 14. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 400 according to the invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 15 is only an exemplary processing system with which the invention may be used. While FIG. 15 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 400. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

One of the advantages of the invention is the use of a thin dielectric layer for providing a tunnel barrier layer within a hole provided in a thicker dielectric layer. This allows the resistance of magnetic memory element, particularly the area for tunneling, to be controlled via adjustments to the surface area, thickness, and material of the tunnel barrier layer, independent of the surface area of the free layer. Furthermore, the thicker dielectric layer surrounding the tunnel barrier layer provides adequate protection against a short being formed across the tunnel barrier layer at edges of the memory element during etching operations. Also the thicker dielectric layer provides an improved etch margin for forming the free layer.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming a magnetic random access memory element, said method comprising:
    forming a pinning structure in electrical communication with a first conductive material;
    forming a first nonmagnetic material adjacent said pinning structure;
    removing a portion of the first nonmagnetic material to form an opening which exposes a portion of the pinning structure;
    forming a second nonmagnetic material adjacent to the first nonmagnetic material and within the opening, wherein the second nonmagnetic material has a first thickness and the first nonmagnetic material has a second thickness where the second thickness is larger than the first thickness, and a portion of the second nonmagnetic material forms a tunnel barrier;
    forming a sensing structure adjacent said second nonmagnetic material; and
    forming a second conductive material in electrical communication with said sensing structure and in proximity to the portion of the second nonmagnetic material forming the tunnel barrier.

2. The method of claim 1 wherein the sensing structure comprises at least a NiFe free layer.

3. The method of claim 2 wherein the sensing structure comprises at least one nonmagnetic layer.

4. The method of claim 3 wherein the at least one nonmagnetic layer and the at least NiFe free layer are successively blanket deposited.

5. The method of claim 2 wherein the pinning structure comprises at least a pinned layer.

6. The method of claim 5 wherein said portion of said second nonmagnetic material forming the tunnel barrier is formed to have a smaller surface area than said pinning structure.

7. The method of claim 5 wherein the pinning structure comprises at least one magnetic layer and at least one nonmagnetic layer.

8. The method of claim 7 wherein the at least one magnetic layer and at least one nonmagnetic layer are successively blanket deposited.

9. The method of claim 8 wherein the blanket deposition comprises magnetron sputtering.

10. The method of claim 1 wherein said second nonmagnetic material comprises aluminum oxide.

11. The method of claim 1, wherein the first thickness is formed to have a thickness in a range of about 5 Angstroms to about 20 Angstroms.

12. The method of claim 1, wherein the second thickness is formed to have a thickness in a range of about 20 Angstroms to about 300 Angstroms.

13. The method of claim 1, wherein the tunnel barrier is formed to extend outside of the opening.

14. The method of claim 1 wherein the opening is formed in a square shape.

15. The method of claim 1 wherein the opening is formed in a circular shape.

16. The method of claim 1 wherein the opening is formed in a rectangular shape.

17. The method of claim 1 wherein the tunnel barrier is positioned off-center with respect to the sensing structure.

* * * * *